(12) United States Patent
Chen

(10) Patent No.: US 7,868,633 B1
(45) Date of Patent: Jan. 11, 2011

(54) MODULAR LIQUID COOLED BURN IN SYSTEM

(75) Inventor: Jeffrey Chen, Irvine, CA (US)

(73) Assignee: EADS North America, Inc., Irvine, CA (US)

( * ) Notice: Subject to any disclaimer, the term of this patent is extended or adjusted under 35 U.S.C. 154(b) by 217 days.

(21) Appl. No.: 12/082,603

(22) Filed: Apr. 12, 2008

(51) Int. Cl.
*G01R 31/02* (2006.01)
(52) U.S. Cl. .................. 324/760; 324/755; 361/704
(58) Field of Classification Search ............ None
See application file for complete search history.

(56) References Cited

U.S. PATENT DOCUMENTS 5,001,548 A * 3/1991 Iversen ................. 257/714
7,420,808 B2 * 9/2008 Campbell et al. ........... 361/699

* cited by examiner

*Primary Examiner*—Minh N Tang

(57) ABSTRACT

An electronic device burn-in thermal management system includes Burn-in-Boards (BIBs) with quick disconnect connectors to easily connect and disconnect the BIB (102) from liquid cooling lines (104, 106) in a rack that can hold one or more BIBs. The BIB (102) may include liquid cooled heat sinks (408) embedded in the BIB sockets (406) in order to cool the electronic devices undergoing burn-in test (DUT). This arrangement allows the DUT to make positive thermal contact with the heat sink when it is mounted in the BIB socket and allows the user to remove the BIB (102) quickly after completing a test to load the next batch of DUTs onto a separate BIB.

15 Claims, 6 Drawing Sheets

MODULAR LIQUID COOLED BURN IN SYSTEM

FIELD OF THE INVENTION

This invention relates in general to thermal systems such as cooling systems and more particularly to a liquid cooling system for use in cooling electronic devices undergoing burn-in testing.

BACKGROUND

Designing test systems to test large numbers of electronic devices such as semiconductors in a factory environment where each individual device undergoing testing generates a significant thermal load is not easy to accomplish. Examples of such heat generating electronic devices include but are not limited to high-speed microprocessors, laser diodes, and linear high-power amplifiers.

From a semiconductor manufacturer's standpoint, factory floor space often comes at a premium. A testing system that is capable of testing the largest number of semiconductor devices in the smallest factory floor footprint is therefore highly desirable. Removing large amounts of heat from high heat dissipation devices in a very small footprint is problematic, however. Air-cooling electronic devices undergoing testing in order to dissipate heat generated by the electronic devices typically requires large heat sinks with a corresponding large surface area and size. Air-cooled systems such as systems employing fans can simply blow air onto the (Device under Test) DUTs in quickly removable Burn-In-Boards (BIBs) without having to move the fans. DUTs can be any type of electronic device such as a power semiconductor, etc. Fan cooling systems have the drawback of sometimes not being able to dissipate a lot of thermal energy away from the DUT, which presents a problem when testing a large number of electronic devices that give off a large amount of thermal energy during testing.

Liquid-cooling electronic devices undergoing testing on the other hand requires a lower corresponding heat exchanger area than air, and can maintain a more narrow range of burn-in temperatures. However, liquid and refrigerant cooling require heat sinks connected to fixed plumbing that need to make intimate thermal contact with the DUT in a removable and repeatable manner. Previous systems use a complicated mechanism to lower liquid cooled heat sinks onto the DUTs during burn-in and retract the heat sinks after the testing is complete. This requires the heat sinks to be mounted on gimbals or other movable structure to accommodate non-planar DUT surfaces but still maintain fluid lines which adds complexity to the test system.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

DETAILED DESCRIPTION

Figure 1:
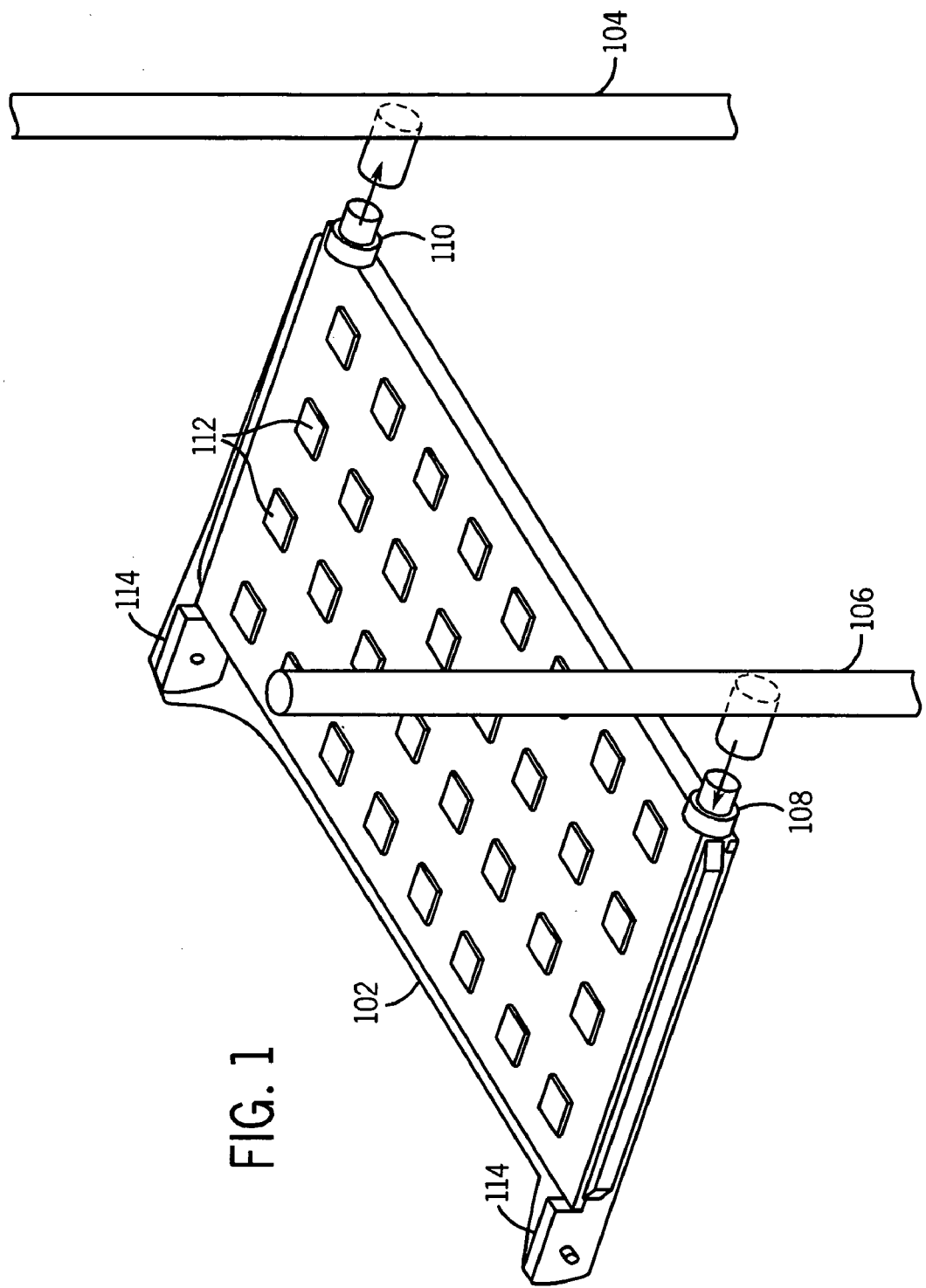
FIG. 1 shows a burn-in-board in accordance with an embodiment of the invention.

While the specification concludes with claims defining the features of the invention that are regarded as novel, it is believed that the invention will be better understood from a consideration of the following description in conjunction with the drawing figures.

One solution for cooling heat generating devices (i.e. DUTs) in accordance with one embodiment of the invention utilizes a test system that uses one or more burn-in-boards (BIBS) which hold the DUTs with liquid cooled heat sinks built into the BIB sockets that hold the DUTs. The BIB sockets provide electric power to and communication with the DUTs while they are being burned in and undergoing testing. One or more surfaces of the DUTs' will make positive thermal contact with the liquid cooled heat sinks found in the BIBs which are embedded in the test sockets, once the DUTs are placed in their corresponding test sockets located in the BIBs. Making "thermal contact" between the liquid cooled heat sink and the DUT at times may not require direct physical contact between the tow, but may at times just require the liquid cooled heat sink to make contact the DUT socket or just be close enough to the DUT to absorb some of the thermal energy being released by the DUT.

In one embodiment, the liquid cooled heat sinks located in the DUT sockets preferably also touch exposed central pin areas normally used for grounding contacts in order to further maximize the amount of the DUT's surface area the liquid cooled heat sink is making contact with and thereby helping to increase the ability to dissipate heat away from the DUTs. In one embodiment, each DUT is locked in place onto its corresponding socket located on the BIB, which then causes the DUT to contact one or more surfaces of the liquid cooled heat sink. The same mechanism that locks the DUT onto its corresponding socket holds the DUT in the socket making intimate contact with the electrical pin connections.

To avoid having to manually disconnect the liquid cooling lines, the BIB has plumbing connecting the heat sinks in each socket to a liquid supply and liquid return modular quick disconnect lines which are mounted on the BIBs electrical connector in one embodiment so the BIB will engage the fluid connections at the same time it engages its electrical connections, when the BIB is placed into a test system rack. In another embodiment, the electrical and liquid supply lines are separate but yet include quick disconnect connectors for easy removal of the BIB. Each test system rack may have one or more BIBs depending on the particular design of the test system. The quick disconnect liquid connectors help reduce the amount of time it takes to mount the BIB and make not only the required electrical connections between the BIB and the rest of the test system but also the liquid input and output supply lines, thereby reducing the time it takes to load a plurality of DUT's onto the test system and have them the DUTs tested.

Blind mate modular quick disconnects, such as those provided by Eaton Aeroquip company or other companies, allow the BIB to connect and disconnect from the rack holding the burn-in equipment necessary to drive the DUTs in a fast, convenient and repeatable manner. This eliminates the need for a separate system that engages and disengages thermal contact with the DUTS when the BIB is loaded into the rack. Seal materials, such as fluoro-elastomers and perfluoro-elastomers allow the modular quick disconnects to handle the high temperatures liquids that would be used to burn in the DUTS using burn-in temperatures of for example 125° C. to 150° C. Other materials may be used to handle different operating temperature requirements as may be needed based on the design requirements of the test system.

Referring now to FIG. 1, there is shown a BIB 102 having a plurality of liquid cooled sockets 112 in accordance with an embodiment of the invention. An input liquid supply line 106 which is located in the test rack (not shown) provides the cooling liquid such as water or other liquid through each of the liquid cooled sockets 112. An output liquid supply line 104 which is also part of the test rack (not shown) collects the heated liquid away from the BIB 102 which flow out of each of the liquid cooled sockets 112. Quick disconnect connectors 108 and 110 connect the BIB 102 to the input 106 and output 104 liquid supply lines which may be located within a test rack which can preferably hold a plurality of BIBs. A set of retention arms 114 can be used to hold the BIB 102 to the rack (not shown).

Figure 2:
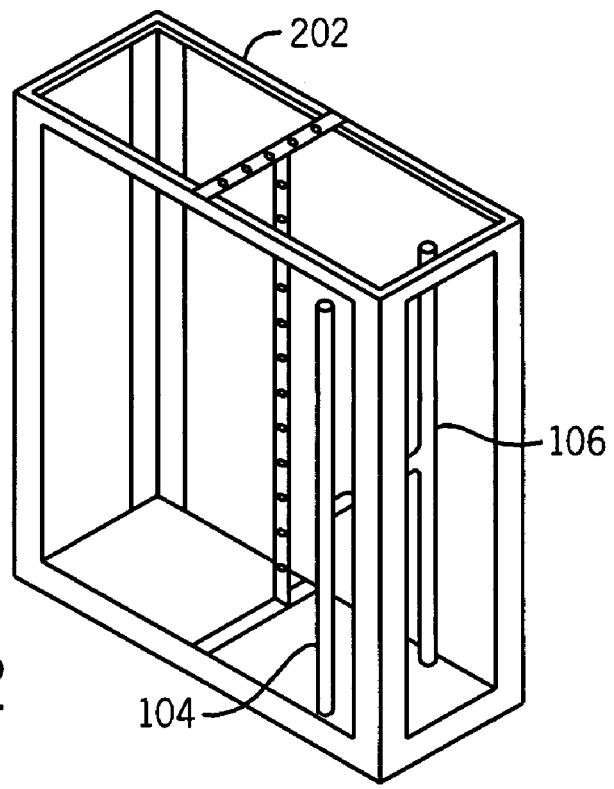
FIG. 2 shows a testing rack in accordance with an embodiment of the invention.
Figure 3:
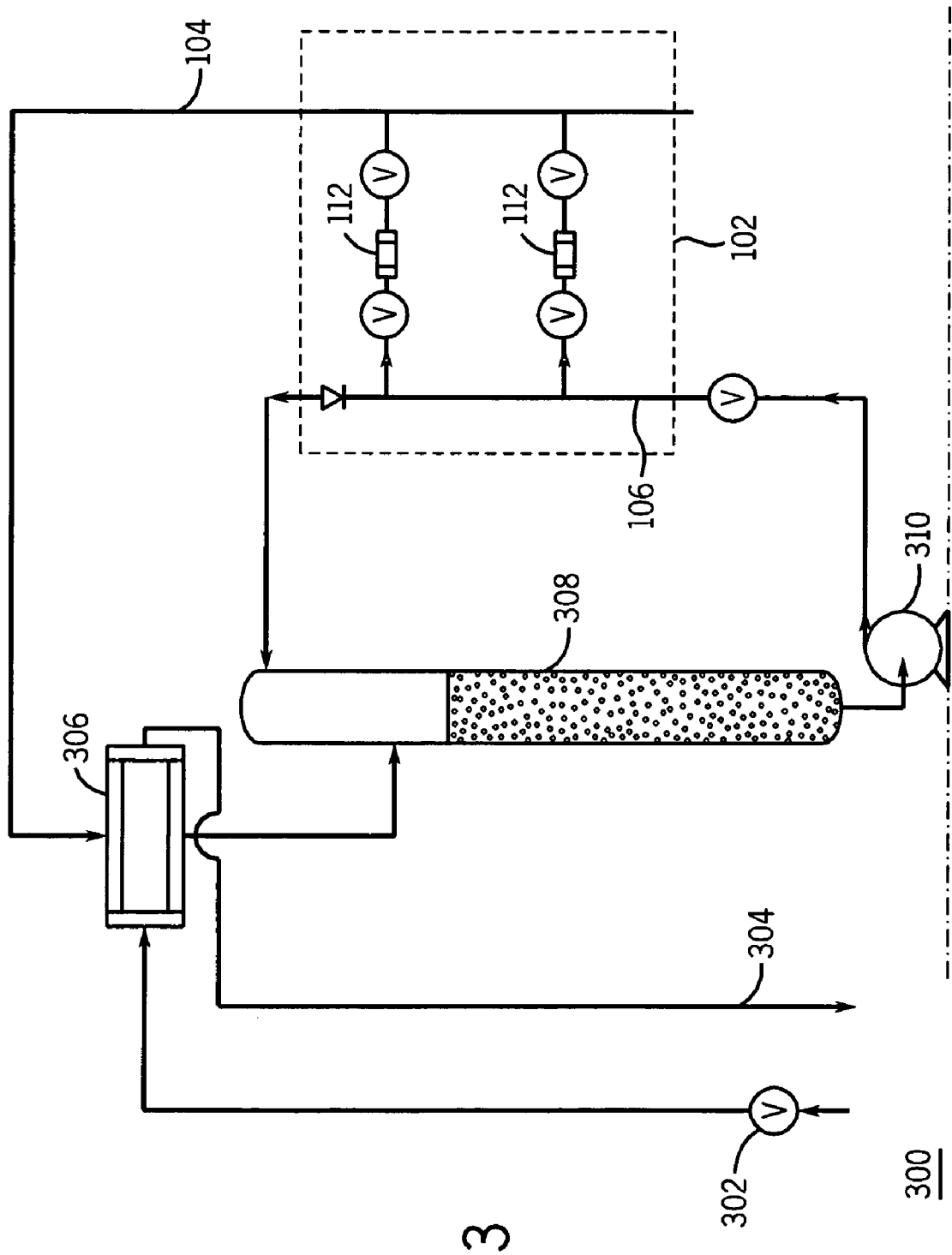
FIG. 3 shows a diagram of a cooling system in accordance with an embodiment of the invention.

In FIG. 2 there is shown a testing rack 202 having the input 106 and output 104 cooling supply lines. A system level diagram of a complete cooling system 300 is shown in FIG. 3. The system 300 includes an input 302 for receiving the cooling liquid such as water from a water faucet and an outlet 304 such as a discharge pipe when the test system needs to be filled for the first time or refilled as some of the cooling fluid dissipates from the system over time. A fluid cooler 306 is used to cool the cooling liquid to a predetermined temperature which can be adjusted by the system operator either manually or remotely under computer control. The fluid cooler 306 can be one of a number of liquid coolers known to those skilled in the art. A storage tank 308 stores the cooled liquid. A pump 310 pumps the cooled liquid into the BIB 102 from the storage tank 308 via the input cooling line 106. The plurality of DUTs 112 are individually cooled and the heat transferred from the hot DUTs is expelled via the output supply line 104 back to the fluid cooler 316 where the cooling liquid is cooled again.

In an illustrative system, each BIB 102 may hold as an example 32 DUTs undergoing testing, with each DUT expending 45 watts of thermal energy for a total of 1440 watts being generated. Using a variability of 30% yields an amount of 1872 watts/BIB slot worst case as the amount of thermal energy that needs to be removed. If a test rack holds 16 BIB slots that would yield 16 slots×1872 watts/slot=29.95 kW×56.907 BTU/minute kW=1704 BTU/minute that will need to be removed per the entire system. Assuming a +/−5° set point temperature tolerance=delta 18° F. temperature range. Given that water has a Cp=1 BTU/lb° F., 1704 BTU/min+(18° F.×1 BTU/lb° F.)=94.66 lb/min, and since water weighs 8.34 lb/gal, yields a minimum flow of 11.35 gallon-per-minute (GPM) per test rack which pump 310 must maintain. A minimum flow of 11.35 GPM ensures a DUT set point within the specification of delta 18° F. temperature range within a DUT variability of 30 percent. The above has just been one illustrative example; other designs can handle different test system requirements. For example, a different cooling refrigerant could be used that has a higher thermal transfer rate, the flow rate could be increased, the size of the heat sink making contact with the DUT could be increased, etc.

Figure 4:
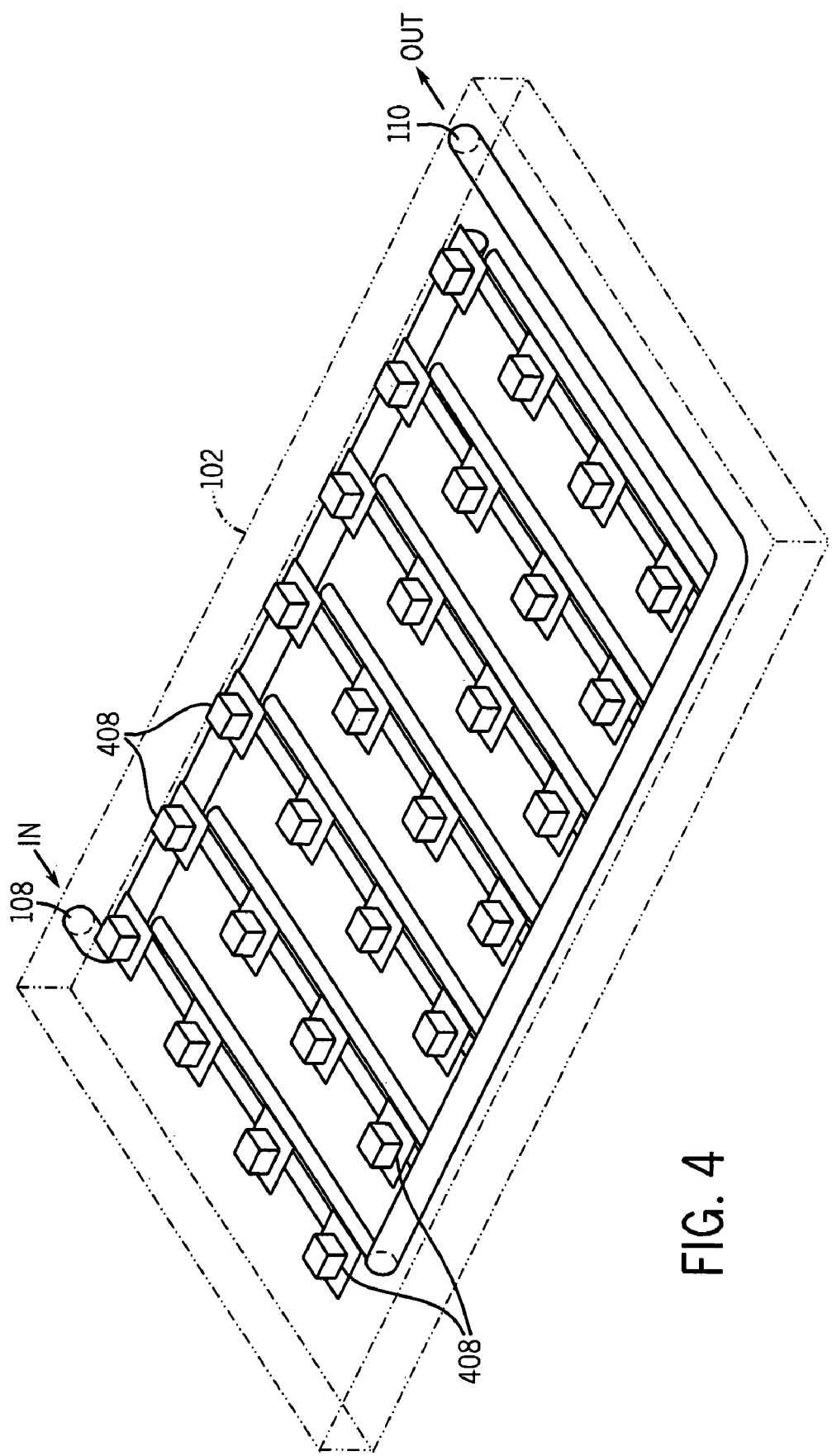
FIG. 4 shows a quick disconnect burn-in-board (BIB) in accordance with one embodiment of the invention.

Referring to FIG. 4, there is shown a BIB 102 highlighting individual opening that allow liquid cooled heat sink chambers 408 to make thermal contact with corresponding DUTs (not shown for clarity). In this illustrative example, underneath each of the sockets 112 (not shown) lie liquid cooled heat sink chambers 408 that receive cooling liquid from BIB liquid input 506 (see FIG. 5), and the liquid is extracted from each of the liquid cooled heat sink chambers 408 via liquid output outlet 508 (see FIG. 5). Each of the liquid inputs 506 are coupled to the corresponding input liquid supply line 106 (shown in FIG. 1) via input connector 108 and each of the liquid outputs 508 are coupled to the corresponding output liquid supply line 104 via output connector 110. Although not shown for clarity, around each opening on BIB 102, a socket 112 would be located on the top surface of the BIB 102 for accepting a DUT. Although shown protruding above the top surface of the BIB 102 in FIG. 4 for the purposes of clarity, the liquid cooled heat sink chambers 408 would typically just extend above the surface via its corresponding opening enough to make thermal contact (e.g., either direct contact or in close enough proximity for thermal energy from the DUT to be conducted away from the DUT and to the heat sink chamber 408 with the DUT or its corresponding socket 112 depending on the particular design requirements. For example, if the DUT once placed on its corresponding socket 112 has enough surface area on its underneath side, (e.g., DUT has its pin on the outer perimeter of the device) the top 504 (see FIG. 504) could make direct contact with bottom of the DUT. In another illustrative design, the top 504 of the liquid cooled heat sink chamber 408 would make contact with the socket 112 instead of the DUT, with thermal energy from the DUT moving from the socket 112 to the liquid cooled heat sink chamber 408.

Figure 5:
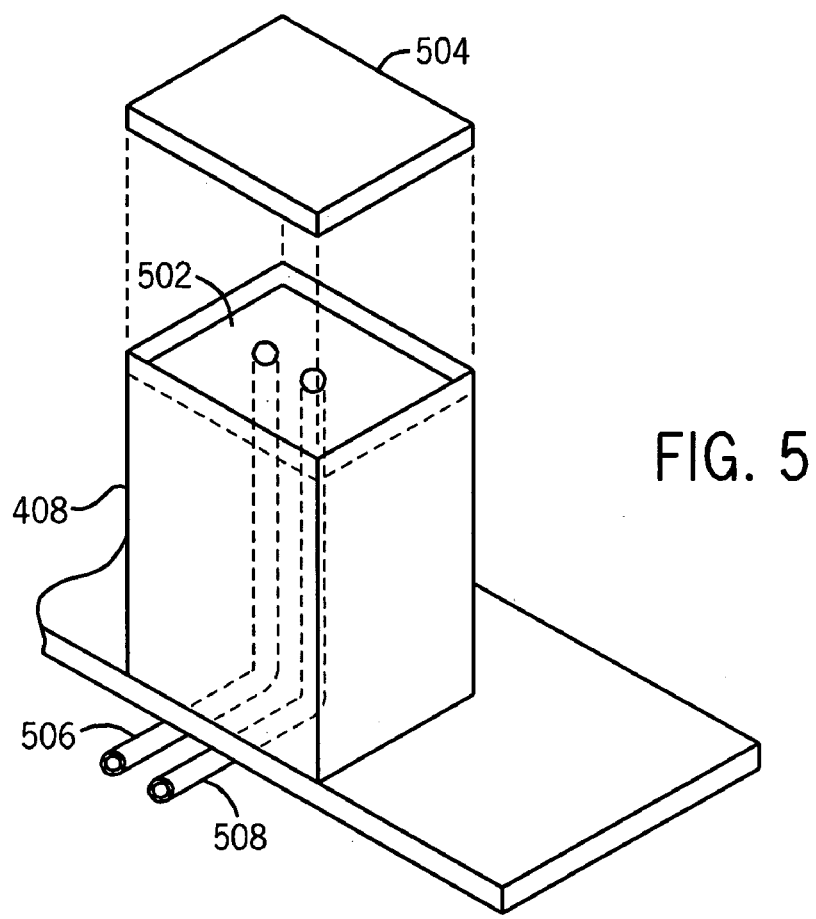
FIG. 5 shows an exploded view of an individual DUT cooler assembly in accordance with an embodiment of the invention.

In FIG. 5 there is shown a more detailed illustration of one of the 408 liquid cooled heat sink chambers (without the DUT electrical socket shown) that receive liquid from an input supply line 506 and outputs the heated liquid via an output supply line 508. A heat transfer top 504 is in thermal contact with a portion (i.e., the bottom, side, etc.) of a DUT socket or DUT itself which allows for the liquid flowing through the chamber cavity 502 to transfer thermal energy away from the DUT undergoing testing in the socket. The location and design of the liquid cooled heat sink chamber 408 can be modified in order to accommodate any particular design requirements, such as size of DUTs to be tested, amount of heat transfer capability required, etc. In one embodiment, when a DUT is placed in its socket, a portion of the DUT makes thermal contact with the liquid cooled heat sink chamber 408

Figure 6:
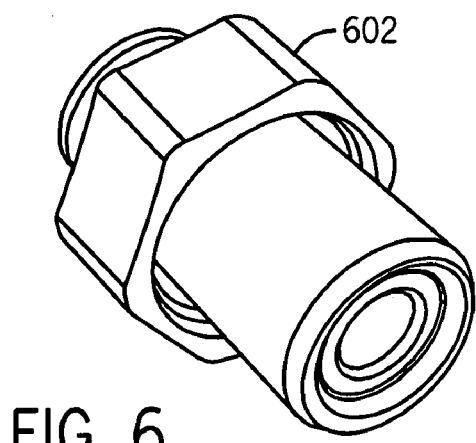
FIGS. 6 and 7 show a pair of quick-disconnect connectors that can be used in association with the invention.
Figure 7:
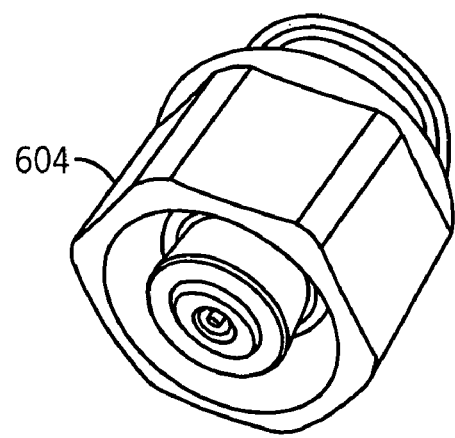
Figure 8:
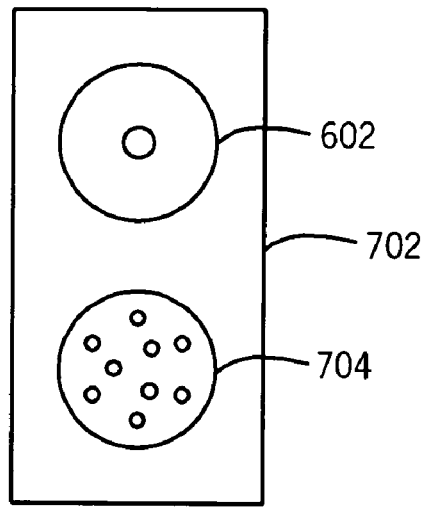
FIG. 8 shows a connector including a liquid connector and an electrical signal connector in accordance with an aspect of the present invention.
Figure 9:
FIG. 9 shows BIB that includes a liquid connector and an electrical signal connector in accordance with an embodiment of the invention.

In FIGS. 6 and 7 there are shown a male 602 and female 604 quick disconnect connectors that can be used to connect the BIB 102 to the testing rack liquid supply lines 104 and 106. For example, the BIBs 102 could have the male quick disconnect connectors and the supply lines 104 and 106 found in the test rack can have corresponding female disconnect connectors located in appropriate locations that match the rack locations each of the plurality of BIBs 102 will be placed in. In one embodiment, the quick disconnect connectors associated with the BIB 102 are designed in association with the electrical connector that supplies electrical power and signal lines to the BIB 102 from the test rack electronics so that when the BIB 102 is placed in the test rack, both electrical power/signal and liquid are coupled at the same time to their corresponding connectors in the test rack. This can be accomplished for example by combining the liquid connector 602/or 604 with a quick disconnect electrical connector 704 as part of one larger connector 702 as shown in FIG. 8 or by having the liquid connector 602/604 and the electrical connector 704 that is part of the BIB 102 be separately located on the BIB 102 but designed so that they both easily connect to their corresponding mating connectors (not shown) when the BIB 102 is placed within the test rack 202 as shown in FIG. 9.

Figure 10:
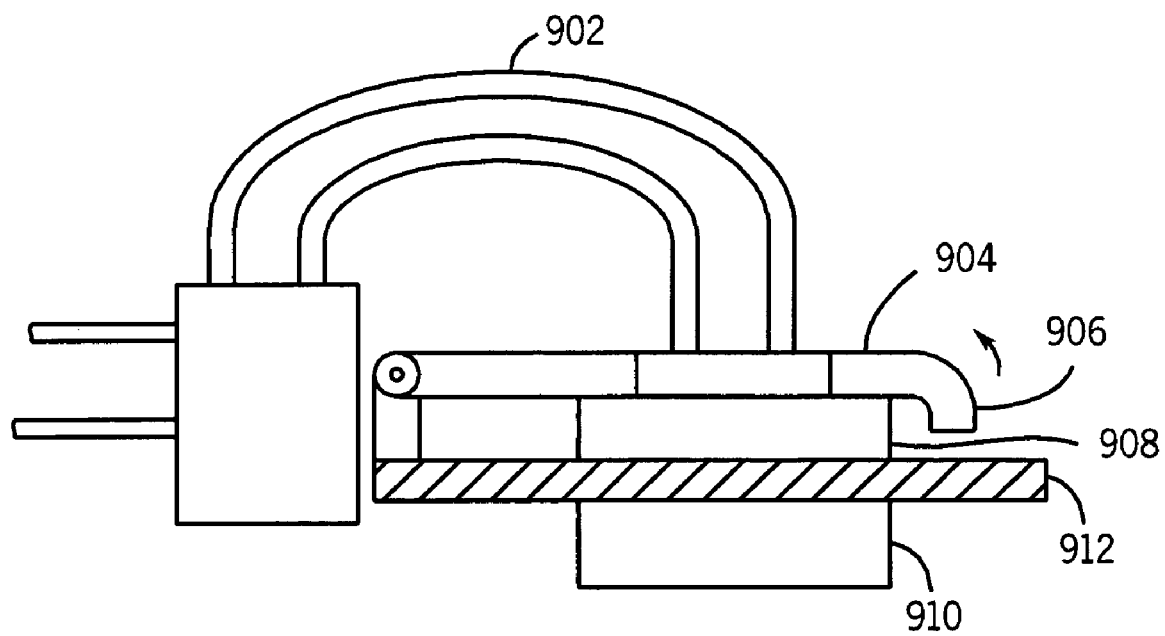
FIG. 10 shows a DUT in a flip top socket in accordance with an alternative embodiment of the invention.

In addition to cooling the DUT, the liquid cooling lines in an alternative embodiment of the invention can be ported to a heat sink 904 located in the top of a clamshell or "flip top" socket 906 so that the heat sink will swing down onto the top of the DUT 908 during burn in as shown in FIG. 10. A set of flexible fluid lines 902 connect to the BIB manifold. A clam shell socket 906 with liquid cooled heat sink 904 in the lid of the flip socket allows for the liquid cooled heat sink 904 to make contact with the top of the DUT 908 and allows it to transfer the thermal energy generated during testing of the DUT 908 away from the DUT 908. This alternative embodiment allows for both bottom and top cooling if required, since a second liquid cooled heat sink 910 can be added to the bottom of the flip top socket 906 or in another location such as one of the sides, etc. The bottom 912 of the flip top socket 906 will preferably have an opening which allows the second cooled heat sink 910 to make thermal contact with the device undergoing testing.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A burn-in board, comprising:
   an electrical socket for receiving an electrical component;
   a liquid cooled heat sink chamber located in thermal proximity to the electrical socket;
   an input liquid supply line coupled to a first quick disconnect connector;
   an output liquid supply line coupled to a second quick disconnect connector;
   the input and output supply lines coupled to the liquid cooled heat sink chamber in order to supply liquid to the liquid cooled heat sink chamber; and
   a flip top coupled to the electrical socket and the liquid cooled heat sink chamber is located on the flip top, the flip top including a hinge for allowing the flip top to move into a closed position over the electrical socket.

2. A burn-in board as defined in claim 1, wherein the liquid cooled heat sink chamber includes a thermal transfer top which is in thermal contact with the electrical outlet.

3. A burn-in board as defined in claim 2, further comprising a liquid chamber cavity that receives cooling liquid from the input liquid supply line.

4. A burn-in board as defined in claim 3, wherein the liquid cooled heat sink chamber includes an input coupled to the input liquid supply line for receiving cooling liquid and an output coupled to the output liquid supply line for removing liquid from the liquid chamber cavity.

5. A burn-in board as defined in claim 1, wherein the first quick disconnect connector is part of a connector that also includes one or more electrical connections.

6. A burn-in board as defined in claim 1, wherein the liquid cooled heat sink chamber comes into thermal contact with the electrical component when the flip top is closed over the electrical socket.

7. A burn-in board as defined in claim 6, further comprising a second liquid cooled heat sink located underneath the electrical socket.

8. A burn-in board as defined in claim 7, wherein the second liquid cooled heat sink is coupled to the input and output liquid supply lines.

9. A burn-in board as defined in claim 1, wherein the input and output supply lines comprise flexible fluid lines.

10. A liquid cooled socket, comprising
    a socket having electrical connections for receiving an electrical component;
    a liquid cooled heat sink chamber located in thermal proximity to the electrical socket;
    input and output liquid supply lines coupled to the liquid cooled heat sink chamber;
    a flip top coupled to the socket including a hinged section; and
    the liquid cooled heat sink chamber is located on the flip top hinged section such that when the flip top is closed over the socket, the liquid cooled heat sink chamber comes into thermal contact with the electrical component.

11. A liquid cooled socket as defined in claim 10, wherein the input and output liquid supply lines are each coupled to quick disconnect connectors.

12. A liquid cooled socket as defined in claim 10, further comprising:
    a second liquid cooled heat sink chamber located on the flip top and underneath the socket.

13. A liquid cooled socket as defined in claim 10, wherein the socket is located on a burn in board.

14. A liquid cooled socket as defined in claim 10, wherein the liquid cooled heat sink chamber includes a heat transfer top that is contact with the socket.

15. A liquid cooled socket as defined in claim 10, wherein the liquid cooled heat sink chamber makes thermal contact with one or more pins located on the electrical component.

* * * * *